US006969579B1

(12) United States Patent
Kitson et al.

(10) Patent No.: US 6,969,579 B1

(45) Date of Patent: Nov. 29, 2005

(54) SOLVENT RESISTANT IMAGEABLE ELEMENT

(75) Inventors: Anthony Paul Kitson, Evans, CO (US); Kevin Barry Ray, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/018,335

(22) Filed: Dec. 21, 2004

(51) Int. Cl.[7] .......................... G03F 7/039; G03F 7/11; G03F 7/30

(52) U.S. Cl. ............................... 430/271.1; 430/270.1; 430/302; 430/330; 430/905; 430/909; 430/910; 430/964; 526/262

(58) Field of Search .......................... 430/270.1, 271.1, 430/302, 330, 909, 910, 905, 964; 526/262

(56) References Cited

U.S. PATENT DOCUMENTS

| | | | | | |
|---|---|---|---|---|---|
| 5,200,462 | A | * | 4/1993 | Sutton et al. | 524/548 |
| 5,252,689 | A | * | 10/1993 | Lucas et al. | 526/227 |
| 5,308,749 | A | * | 5/1994 | Sutton et al. | 435/5 |
| 5,731,127 | A | | 3/1998 | Ishizuka et al. | |
| 6,060,217 | A | | 5/2000 | Nguyen et al. | |
| 6,143,464 | A | | 11/2000 | Kawauchi | |
| 6,352,811 | B1 | | 3/2002 | Patel et al. | |
| 6,475,692 | B1 | | 11/2002 | Jarek et al. | |
| 6,525,152 | B1 | | 2/2003 | Jarek | |
| 6,783,911 | B2 | | 8/2004 | Mulligan | |
| 6,824,947 | B2 | | 11/2004 | Ishizuka et al. | |
| 2003/0194633 | A1 | | 10/2003 | Jarek | |
| 2003/0203312 | A1 | | 10/2003 | Serikawa et al. | |

FOREIGN PATENT DOCUMENTS

| | | |
|---|---|---|
| JP | H11-119419 | 4/1999 |
| JP | 2000-330265 | 11/2000 |

* cited by examiner

*Primary Examiner*—Richard L. Schilling
(74) *Attorney, Agent, or Firm*—Ratner Prestia

(57) ABSTRACT

Thermally imageable elements useful as lithographic printing plate precursors are disclosed. The elements may be either single layer or multilayer elements and comprise an alkali soluble co-polymer, or a mixture of alkali soluble co-polymers. The resulting printing plates have good resistance to pressroom chemicals.

29 Claims, No Drawings

SOLVENT RESISTANT IMAGEABLE ELEMENT

FIELD OF THE INVENTION

The invention relates to lithographic printing. In particular, this invention relates to imageable elements useful as lithographic printing plate precursors that have good solvent resistance.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise an imageable layer (top layer) applied over the hydrophilic surface of a substrate. The imageable layer includes one or more radiation-sensitive components, which may be dispersed in a suitable binder. Alternatively, the radiation-sensitive component can also be the binder material. Following imaging, either the imaged regions or the unimaged regions of the imageable layer are removed by a suitable developer, revealing the underlying hydrophilic surface of the substrate. If the imaged regions are removed, the precursor is positive working. Conversely, if the unimaged regions are removed, the precursor is negative working. In each instance, the regions of the imageable layer (i.e., the image areas) that remain are ink-receptive, and the regions of the hydrophilic surface revealed by the developing process accept water and aqueous solutions, typically a fountain solution, and repel ink.

Conventional imaging of the imageable element with ultraviolet and/or visible radiation was carried out through a mask, which has clear and opaque regions. Imaging takes place in the regions under the clear regions of the mask but does not occur in the regions under the opaque regions. However, direct digital imaging, which obviates the need for imaging through a mask, is becoming increasingly important in the printing industry. Imageable elements for the preparation of lithographic printing plates have been developed for use with infrared lasers. Thermally imageable, single layer elements are disclosed in, for example, West, U.S. Pat. No. 6,090,532; Parsons, U.S. Pat. No. 6,280,899; McCullough, U.S. Pat. No. 6,596,469; and WO99/21715, the disclosures of which are all incorporated herein by reference. Thermally imageable, multi-layer elements are disclosed, for example, in Shimazu, U.S. Pat. No. 6,294,311, U.S. Pat. No. 6,352,812, and U.S. Pat. No. 6,593,055; Patel, U.S. Pat. No. 6,352,811; Savariar-Hauck, U.S. Pat. No. 6,358,669, and U.S. Pat. No. 6,528,228; and Kitson, 2004/0067432 A1; the disclosures of which are all incorporated herein by reference.

In use, a lithographic printing plate comes in contact with fountain solution. In addition, the printing plate is often subjected to aggressive blanket washes, such as a "UV wash" to remove ultraviolet curable inks. However, many of these systems have limited resistance to either fountain solution and/or aggressive blanket washes. Thus, a need exists for thermally imageable elements, useful as a lithographic printing plate precursors, that have resistance to these solvents.

SUMMARY OF THE INVENTION

In one aspect, the invention is an imageable element comprising a top layer over a substrate. The imageable element comprises a co-polymer, or mixture of copolymers, that comprise, in polymerized form:

(a) about 10 wt % to 75 wt % of a monomer selected from the group consisting of monomers of structure I, monomers of structure II, and mixtures thereof;

Structure I

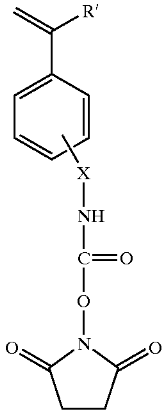

Structure II

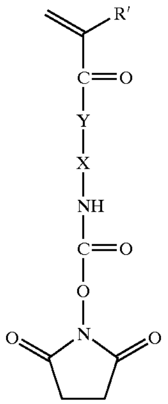

in which:

R' is hydrogen, halogen, or $C_1$ to $C_6$ alkyl;

X is $-C(CH_3)_2-$, $-(CH_2)_n-$, or $-CH(CH_3)-$;

Y=$-N(H)-$ or $-O-$; and n=0 to 12;

the co-polymer or mixture of copolymers is soluble in an alkaline solution having a pH greater than about 8;

the top layer is not removable by an alkaline developer before thermal imaging; and imaged regions of the top layer are removable by the alkaline developer after thermal imaging.

The co-polymer typically further comprises, in polymerized form, one or more of, more typically two or more of, even more typically three of: (b) about 1 mol % to about 55 mol % of a monomer selected from the group consisting of N-phenylmaleimide, N-cyclohexylmaleimide, N-benzylmaleimide, and mixtures thereof; (c) about 5 mol % to about 40 mol % of a monomer selected from the group consisting of acrylic acid, methacrylic acid, and mixtures thereof; (d) about 1 wt % to about 30 wt % of a monomer selected from the group consisting of acrylamide, methacrylamide, and mixtures thereof; and (e) about 20 wt % to about 80 wt % of a monomer selected from the group consisting of acrylonitrile, methacrylonitrile, and mixtures thereof.

The imageable elements, which are useful as lithographic printing plate precursors, may be single layer imageable elements or multi-layer imageable elements. In yet another aspect, the invention is a method for forming an image by imaging and developing the imageable element.

DETAILED DESCRIPTION OF THE INVENTION

Unless the context indicates otherwise, in the specification and claims, the terms alkali soluble co-polymer, added polymer, photothermal conversion material, surfactant, and similar terms also include mixtures of such materials. Unless otherwise specified, all percentages are percentages by weight and all temperatures are in degrees Centigrade (degrees Celsius). Thermal imaging refers to imaging with a hot body, such as a thermal head, or with infrared radiation.

Alkali Soluble Co-Polymers

The imageable elements comprise one or more alkali soluble co-polymers. The alkali soluble co-polymers are soluble in alkaline solutions having a pH greater than at least about 8, typically soluble in alkaline solutions having a pH greater than at least about 12, more typically soluble in alkaline solutions having a pH of about 12 to about 14, such as about 13.5.

The alkali co-polymers comprise, in polymerized form about 10 wt % to 75 wt % of a monomer selected from the group consisting of monomers of structure I, monomers of structure II, and mixtures thereof.

Structure I

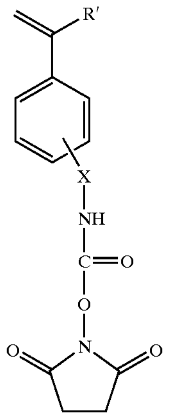

Structure II

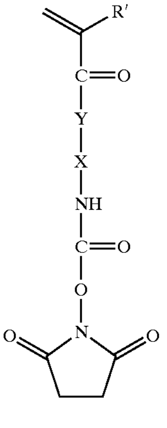

R' is hydrogen, halogen, or $C_1$ to $C_6$ alkyl. Typical $C_1$ to $C_6$ alkyl groups are, for example, methyl, ethyl, n-propyl, n-butyl, n-pentyl, and n-hexyl. Preferred groups for R' include hydrogen and methyl. Methyl is more preferred. Halogen includes fluoro (F), chloro (Cl), and bromo (Br). X is $—C(CH_3)_2—$, $—(CH_2)_n—$, or $—CH(CH_3)—$, in which n is an integer of 0 to 12, typically an integer of 0 to 4. Y is —N(H)— or —O—.

In addition to the monomer or monomers of (a), the co-polymer typically further comprises, in polymerized form, one or more of, more typically two or more of, even more typically three of: (b) about 1 mol % to about 55 mol % of a monomer selected from the group consisting of N-phenylmaleimide, N-cyclohexylmaleimide, N-benzylmaleimide, and mixtures thereof, preferably N-phenylmaleimide; (c) about 5 mol % to about 40 mol % of a monomer selected from the group consisting of acrylic acid, methacrylic acid, and mixtures thereof, preferably methacrylic acid; (d) about 1 wt % to about 30 wt % of a monomer selected from the group consisting of acryl amide, methacryl amide, and mixtures thereof, preferably methacryl amide; and (e) about 20 wt % to about 80 wt % of a monomer selected from the group consisting of acrylonitrile, methacrylonitrile, and mixtures thereof, preferably acrylonitrile. More typically, in addition to the monomer or monomers of (a), the co-polymer further comprises (b) about 1 mol % to about 55 mol % of a monomer selected from the group consisting of N-phenylmaleimide, N-cyclohexylmaleimide, N-benzylmaleimide, and mixtures thereof, preferably N-phenylmaleimide, and two or more of (c) about 5 mol % to about 40 mol % of a monomer selected from the group consisting of acrylic acid, methacrylic acid, and mixtures thereof, preferably methacrylic acid: (d) about 1 wt % to about 30 wt % of a monomer selected from the group consisting of acryl amide, methacryl amide, and mixtures thereof, preferably methacryl amide; and (e) about 20 wt % to about 80 wt % of a monomer selected from the group consisting of acrylonitrile, methacrylonitrile, and mixtures thereof, preferably acrylonitrile.

The alkali soluble co-polymers may comprise, in polymerized form, one or more additional monomers. Monomers that contain ionizable groups may be present to enhance or control the solubility characteristics of the co-polymer in aqueous base. Other additional monomers include, for example, the acryl amide or methacryl amide of an amino benzoic acid, such as the acryl amide or methacryl amide p-amino benzoic acid ($CH_2=C(R'')—CONH$-p-$C_6H_4—CO_2H$, in which R" is hydrogen or methyl), and the half esters formed from the reaction of a cyclic anhydride, such as succinic anhydride or phthalic anhydride, with an acrylate or methacrylate that contains a hydroxyl group, such as 2-hydroxyethyl methacrylate or 2-hydroxyethyl acrylate ($CH_2=C(R'')—CO_2—CH_2CH_2—O_2C—W—CO_2H$, in which R" is hydrogen or methyl and W is $—[(CH_2)_2]—$ or -[o-$C_6H_4$]—).

The co-polymers may be prepared by, for example, free radical polymerization. Free radical polymerization is well known to those skilled in the art and is described, for example, in Chapters 20 and 21, of *Macromolecules*, Vol. 2, 2nd Ed., H. G. Elias, Plenum, New York, 1984. Useful free radical initiators are peroxides such as benzoyl peroxide, hydroperoxides such as cumyl hydroperoxide and azo compounds such as 2,2'-azobis(isobutyronitrile) (AIBN). Chain transfer agents, such as dodecyl mercaptan, may be used to control the molecular weight of the compound. Suitable solvents for free radical polymerization include liquids that are inert to the reactants and which will not otherwise adversely affect the reaction, for example, water; esters such as ethyl acetate and butyl acetate; ketones such as methyl ethyl ketone, methyl isobutyl ketone, methyl propyl ketone, and acetone; alcohols such as methanol, ethanol, iso-propyl alcohol, n-propanol, 2-methoxyethanol (Methyl CELLOSOLVE®), n-butanol; ethers such as dioxane and tetrahydrofuran; amides, such as, N,N-dimethylformamide and N,N-dimethylacetamide, and mixtures thereof.

The monomers indicated above may be polymerized in the desired amounts to produce the desired alkali soluble co-polymer. Typical precursors for the monomers of structure I include, for example, the compounds formed from the reaction of N-hydroxysuccinimde with, for example, 1-(1-isocyanato-1-methyl)-ethyl-3-(1-methyl)-ethenyl benzene ($CH_2$=C($CH_3$)-m-$C_6H_4$—C($CH_3$)$_2$—NCO); 1-(1-isocyanato-1-methyl)-ethyl-2-(1-methyl)-ethenyl benzene ($CH_2$=C($CH_3$)-o-$C_6H_4$—C($CH_3$)$_2$—NCO); 1-(1-isocyanato-1-methyl)-ethyl-4-(1-methyl)-ethenyl benzene ($CH_2$=C($CH_3$)-p-$C_6H_4$—C($CH_3$)$_2$—NCO); 1-(1-isocyanato-1-methyl)-ethyl-3-ethenyl benzene ($CH_2$=CH-m-$C_6H_4$—C($CH_3$)$_2$—NCO); 1-(1-isocyanato-1-methyl)-ethyl-2-(1-methyl)-ethenyl benzene ($CH_2$=CH-o-$C_6H_4$—C($CH_3$)$_2$—NCO); 1-(1-isocyanato-1-methyl)-ethyl-4-(1-methyl)-ethenyl benzene ($CH_2$=C($CH_3$)-p-$C_6H_4$—C($CH_3$)$_2$—NCO); 1-(1-isocyanato)-ethyl-3-(1-methyl)-ethenyl benzene ($CH_2$=C($CH_3$)-m-$C_6H_4$—CH($CH_3$)—NCO); 1-(1-isocyanato)-ethyl-3-ethenyl benzene ($CH_2$=CH-m-$C_6H_4$—CH($CH_3$)—NCO); 1-(2-isocyanatoethyl-3-(1-methyl)-ethenyl benzene ($CH_2$=C($CH_3$)-m-$C_6H_4$—($CH_2$)$_2$—NCO); 1-(2-isocyanatoethyl-2-(1-methyl)-ethenyl benzene ($CH_2$=C($CH_3$)-o-$C_6H_4$—($CH_2$)$_2$—NCO); 1-(2-isocyanatoethyl-4-(1-methyl)-ethenyl benzene ($CH_2$=C($CH_3$)-p-$C_6H_4$—($CH_2$)$_2$—NCO); 1-(2-isocyanatoethyl-3-ethenyl benzene ($CH_2$=CH-m-$C_6H_4$—($CH_2$)$_2$—NCO); 1-(2-isocyanatoethyl-2-ethenyl benzene ($CH_2$=CH-o-$C_6H_4$—($CH_2$)$_2$—NCO); 1-(2-isocyanatoethyl-4-ethenyl benzene ($CH_2$=CH-p-$C_6H_4$—($CH_2$)$_2$—NCO); 1-(3-isocyanatopropyl)-3-(1-methyl)-ethenyl benzene ($CH_2$=C($CH_3$)-m-$C_6H_4$—($CH_2$)$_3$—NCO); 1-(4-isocyanatobutyl)-3-(1-methyl)-ethenyl benzene ($CH_2$=C($CH_3$)-m-$C_6H_4$—($CH_2$)$_4$—NCO); and mixtures thereof.

Typical precursors for the monomers of structure II are, for example, the compounds formed from the reaction of N-hydroxysuccinimde with, for example, 2-(methacryloyloxy)ethyl isocyanate ($CH_2$=C($CH_3$)—C(O)O—($CH_2$)$_2$—NCO); 2-(acryloyloxy)ethyl isocyanate ($CH_2$=CH—C(O)O—($CH_2$)$_2$—NCO); 3-(methacryloyloxy)propyl isocyanate ($CH_2$=C($CH_3$)—C(O)O—($CH_2$)$_3$—NCO); 3-(acryloyloxy)propyl isocyanate ($CH_2$=CH—C(O)O—($CH_2$)$_3$—NCO); 4-(methacryloyloxy)butyl isocyanate ($CH_2$=C($CH_3$)—C(O)O—($CH_2$)$_4$—NCO); 4-(acryloyloxy)butyl isocyanate ($CH_2$=CH—C(O)O—($CH_2$)$_4$—NCO); 2-isocyanatoethyl methacrylamide ($CH_2$=C($CH_3$)—C(O)NH—($CH_2$)$_2$—NCO); 2-isocyanatoethyl acrylamide $CH_2$=CH—C(O)NH—($CH_2$)$_2$—NCO); 3-isocyanatopropyl methacrylamide ($CH_2$=C($CH_3$)—C(O)NH—($CH_2$)$_3$—NCO); 3-isocyanatopropyl acrylamide $CH_2$=CH—C(O)NH—($CH_2$)$_3$—NCO); and mixtures thereof.

Although preparation of the alkali soluble co-polymers has been described in terms of monomers that can be co-polymerized to form the co-polymers, this does not limit the co-polymers to those formed by this method. The co-polymers may be formed by other routes, such as by modification of precursor polymers. For example, isocyanate containing monomers, such as those listed above, can be co-polymerized to form isocyanate containing precursor polymers. N-hydroxysuccinimde can be reacted with these precursor polymer to form the alkali soluble co-polymer. Other procedures for forming the alkali soluble co-polymers will be apparent to those skilled in the art.

Imageable Elements

The alkali soluble co-polymers may be used in positive working imageable elements. The imageable element comprises an imageable layer or top layer, which comprises an imageable composition, over the surface of a substrate. Other layers that are conventional components of imageable elements may also be present. For example, the top layer may be on the substrate, or other layers, such as an underlayer, may be present between the top layer and the substrate. The imageable element also comprises a photothermal conversion material, which may be present in the top layer, in an underlayer, or in a separate absorber layer between the top layer and the underlayer if the underlayer is present, or between the top layer and the substrate if the underlayer is not present.

Substrate

The substrate comprises a support, which may be any material conventionally used to prepare imageable elements useful as lithographic printing plates. The support is preferably strong, stable, and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to improve adhesion to subsequent layers. The nature of this layer or layers depends upon the substrate and the composition of subsequent layer or layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

When the substrate comprises a sheet of aluminum or an aluminum alloy, it should be of sufficient thickness to sustain the wear from printing and thin enough to wrap around a cylinder in a printing press, typically about 100 $\mu$m to about 600 $\mu$m. It is typically cleaned, roughened, and anodized by various methods known in the art. Initially, a degreasing treatment with a surfactant, an organic solvent, or an alkaline water solution is typically administered to remove oil and grease from the surface of the sheet. Then the surface may be roughened by well known techniques, such as mechanical roughening, for example ball polishing, brush polishing, blast polishing and buff polishing, chemical roughening in which the surface is roughened by selectively dissolving the surface, or electrochemical roughening, or a combination of such chemical, mechanical, and/or electrochemical treatments (multi-graining). Etching of the substrate is performed using hot acidic (such as sulfuric or phosphoric) solutions or alkaline solutions (such as sodium hydroxide or trisodium phosphate mixed with sodium hydroxide). Anodic oxidation may be carried out to form a hydrophilic layer of aluminum oxide of the surface, typically a layer of aluminum oxide of at least 0.3 g/m$^2$ in weight. Anodic oxidation is performed by passing a current using the support as an anode in an electrolytic solution comprising an electrolyte, such as, for example, sulfuric acid, phosphoric acid, chromic acid, boric acid, citric acid, oxalic acid, or a mixture thereof. Anodic oxidation is disclosed, for example, in Fromson, U.S. Pat. No. 3,280,734, and Chu, U.S. Pat. No. 5,152,158.

Then, the cleaned, roughened, and anodized support may be hydrophilized with an alkali metal silicate, such as aqueous potassium silicate, lithium silicate, or, typically, sodium silicate. Hydrophilization is described, for example, in Jewett, U.S. Pat. No. 2,714,066, and Fromson, U.S. Pat. No. 3,181,461. The support is either immersed in or electrolyzed in an aqueous solution of the alkali metal silicate.

Typically, the substrate comprises an interlayer between the aluminum support and the overlying layer or layers. The interlayer may be formed by treatment of the aluminum support with, for example, silicate, dextrine, hexafluorosilicic acid, phosphate/fluoride, polyvinyl phosphonic acid (PVPA), vinyl phosphonic acid copolymers, or a water-soluble diazo resin. Co-polymers that comprise (1) phosphonic acid groups and/or phosphate groups, and (2) acid groups and/or groups that comprise alkylene glycol or polyalkylene glycol side chains, which are useful as interlayer materials, are also disclosed in U.S. patent application Ser. No. 10/922,782, filed Aug. 20, 2004, the disclosure of which are incorporated herein by reference. Co-polymers that comprise (1) acid groups and/or phosphonic acid groups, and (2) silyl groups substituted with three alkoxy and/or phenoxy groups, useful as interlayer materials, are disclosed in U.S. patent application Ser. No. 10/928,339, filed Aug. 27, 2004, the disclosure of which are incorporated herein by reference.

The back side of the support (i.e., the side opposite the top layer and, if present, the underlayer) may be coated with an antistatic agent and/or a slipping layer or matte layer to improve handling and "feel" of the imageable element.

Multi-Layer Elements

Multi-layer elements comprise a top layer or imageable layer over an underlayer, which is over the substrate. Other layers, such as an absorber layer and/or a barrier layer may also be present. When an underlayer is present, the underlayer comprises the alkali soluble co-polymer or mixture of alkali soluble copolymers. The coating weight for the top layer is typically about 0.5 $g/m^2$ to about 2.5 $g/m^2$, preferably about 0.5 $g/m^2$ to about 1.5 $g/m^2$.

Any top layer used in multi-layer thermally imageable elements may be used with the imageable elements of the invention. These are described for example in Savariar-Hauck, U.S. Pat. No. 6,358,669, the disclosure of which is incorporated herein by reference, Hauck, U.S. Pat. No. 6,555,291, the disclosure of which is incorporated herein by reference, and Kitson, 2004/0067432 A1, the disclosure of which is incorporated herein by reference. Styrene/maleic anhydride co-polymers, such as 1:1 styrene/maleic anhydride co-polymers, and methyl methacrylate/methacrylic acid co-polymers, such as co-polymers in which the ratio of methyl methacrylate to methacrylic acid is about 90:10 to about 95:5, may also be used in the top layer. These top layers are disclosed in U.S. patent application Ser. No. 11/005,548, filed Dec. 6, 2004, the disclosure of which is incorporated herein by reference.

The top layer of a multi-layer imageable element is over the underlayer. It becomes soluble or dispersible in the developer following thermal exposure. It typically comprises an ink-receptive polymeric material, known as the binder, and a dissolution inhibitor. Alternatively, or additionally, the polymeric material comprises polar groups and acts as both the binder and dissolution inhibitor. Other materials that are conventional components of the top layer of multi-layer imageable elements may also be present.

The binder in the top layer may be a light-stable, water-insoluble, developer-soluble, film-forming phenolic resin. Phenolic resins have a multiplicity of phenolic hydroxyl groups, either on the polymer backbone or on pendent groups. Novolac resins, resol resins, acrylic resins that contain pendent phenol groups, and polyvinyl phenol resins are preferred phenolic resins. Novolac resins are more preferred. Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or a ketone, such as acetone, in the presence of an acid catalyst. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of m-cresol and p-cresol, or phenol with formaldehyde using conventional conditions.

A solvent soluble novolac resin is one that is sufficiently soluble in a coating solvent to produce a coating solution that can be coated to produce a top layer. In some cases, it may be desirable to use a novolac resin with the highest weight average molecular weight that maintains its solubility in common coating solvents, such as acetone, tetrahydrofuran, and 1-methoxypropan-2-ol. Top layers comprising novolac resins, including for example m-cresol only novolac resins (i.e. those that contain at least about 97 mol % m-cresol) and m-cresol/p-cresol novolac resins that have up to 10 mol % of p-cresol, having a weight average molecular weight of about 10,000 to at least about 25,000, may be used. Top layers comprising m-cresol/p-cresol novolac resins with at least 10 mol % p-cresol, having a weight average molecular weight of about 8,000 to about 25,000, may also be used. In some instances, novolac resins prepared by solvent condensation may be desirable. Top layers comprising these resins are disclosed in Kitson, 2004/0067432 A1, the disclosure of which is incorporated herein by reference.

Top layers comprising a phenolic resin comprise a dissolution inhibitor, which functions as a solubility-suppressing component for a binder that contains hydroxyl groups. Dissolution inhibitors have polar functional groups that are believed to act as acceptor sites for hydrogen bonding with the hydroxyl groups present in the binder. The acceptor sites comprise atoms with high electron density, preferably selected from electronegative first row elements, especially carbon, nitrogen, and oxygen. Dissolution inhibitors that are soluble in the developer are preferred.

Useful polar groups for dissolution inhibitors include, for example, diazo groups; diazonium groups; keto groups; sulfonic acid ester groups; phosphate ester groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds that contain a positively charged (i.e., quaternized) nitrogen atom useful as dissolution inhibitors include, for example, tetraalkyl ammonium compounds, and quaternized heterocyclic compounds such as quinolinium compounds, benzothiazolium compounds, pyridinium compounds, and imidazolium compounds. Compounds containing other polar groups, such as ether, amine, azo, nitro, ferrocenium, sulfoxide, sulfone, and disulfone may also be useful as dissolution inhibitors.

The dissolution inhibitor may be a monomeric and/or polymeric compound that comprises a diazobenzoquinone moiety and/or a diazonaphthoquinone moiety. Other useful dissolution inhibitors are triarylmethane dyes, such as ethyl violet, crystal violet, malachite green, brilliant green, Victoria blue B, Victoria blue R, Victoria blue BO, BASONYL® Violet 610, and D11 (PCAS, Longjumeau, France). These dyes can also act as contrast dyes, which distinguish the unimaged regions from the imaged regions in the developed imageable element. When a dissolution inhibitor is present in the top layer, it typically comprises at least about 0.1 wt %, typically about 0.5 wt % to about 30 wt %, preferably about 1 wt % to 15 wt %, based on the dry weight of the layer.

Alternatively, or additionally, the polymeric material in the top layer can comprise polar groups that act as acceptor sites for hydrogen bonding with the hydroxy groups present in the polymeric material and, thus, act as both the polymeric material and dissolution inhibitor. The level of derivatization should be high enough that the polymeric material acts as a dissolution inhibitor, but not so high that, following thermal imaging, the polymeric material is not soluble in the developer. Although the degree of derivatization required will depend on the nature of the polymeric material and the nature of the moiety containing the polar groups introduced into the polymeric material, typically about 0.5 mol % to about 5 mol %, preferably about 1 mol % to about 3 mol %, of the hydroxyl groups will be derivatized. Derivatization of phenolic resins with compounds that contain the diazonaphthoquinone moiety is well known and is described, for example, in West, U.S. Pat. Nos. 5,705,308, and 5,705,322.

One group of polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A useful material is a novolac resin in which about 1 mol % to 3 mol %, preferably about 1.5 mol % to about 2.5 mol %, of the hydroxyl groups have been converted to phenyl sulfonate or p-toluene sulfonate (tosyl) groups.

Underlayer

The underlayer is between the top layer and the substrate. It is over the substrate and, typically, on the substrate. When an absorber layer is present, it is between the top layer and the underlayer. The coating weight for underlayer is typically about 0.5 $g/m^2$ to about 3 $g/m^2$, preferably about 1 $g/m^2$ to about 1.5 $g/m^2$.

The underlayer comprises the alkali soluble co-polymer. When an absorber layer is not present, the underlayer comprises the photothermal conversion material. When the absorber layer is present, the underlayer typically does not comprise the photothermal conversion, although the photothermal conversion material may also be present in the underlayer.

Other ingredients that are conventional components of underlayers of multi-layer thermally imageable elements, such as added polymers and surfactants, may also be present in the underlayer. When present, surfactants typically comprise about 0.1 wt % to 1 wt % of the underlayer.

The underlayer may also comprise one or more added polymers, provided addition of these polymers does not adversely affect the chemical resistance and solubility properties of the underlayer. Useful added polymers include carboxy functional acrylics, vinyl acetate/crotonate/vinyl neodecanoate co-polymers phenolic resins, maleated wood rosin, and combinations thereof. Other useful added polymers are disclosed in Shimazu, U.S. Pat. No. 6,294,311, incorporated herein by reference. Particularly useful polymeric materials are polyvinylacetals and copolymers that comprise N-substituted maleimides, especially N-phenylmaleimide; methacrylamides, especially methacrylamide; and acrylic and/or methacrylic acid, especially methacrylic acid. The preferred polymeric materials of this type are co-polymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid. These polymeric materials are soluble in a methyl lactate/methanol/dioxolane (15:42.5:42.5 wt %) mixture, which can be used as the coating solvent for the underlayer. However, they are poorly soluble in solvents such as acetone and toluene, which can be used as solvents to coat the top layer over the underlayer without dissolving the underlayer. The bakable polymers disclosed in U.S. patent application Ser. No. 10/641,888, filed Aug. 14, 2003; U.S. patent application Ser. No. 10/820,546, filed Apr. 8, 2004; and U.S. patent application Ser. No. 10/681,701, filed Oct. 8, 2003; the disclosures of which are all incorporated herein by reference, may also be used. When present, the added polymer or polymers comprise about 20 wt % to about 80 wt %, especially about 30 wt % to about 50 wt % of the underlayer.

Other Layers

When an absorber layer is present, it is between the top layer and the substrate. When an underlayer is also present, the absorber layer is between the top layer and the underlayer.

The photothermal conversion material may be present in a separate absorber layer. The absorber layer preferably consists essentially of the infrared absorbing compound and, optionally, a surfactant. It may be possible to use less of the infrared absorbing compound if it is present in a separate absorber layer rather than either the underlayer and/or the top layer. When an absorber layer is present, the top layer is preferably substantially free of infrared absorbing compound, i.e. the top layer preferably does not absorb radiation used for imaging, typically radiation in the range of 800 nm to 1200 nm. The absorber layer preferably has a thickness sufficient to absorb at least 90%, preferably at least 99%, of the imaging radiation. Typically, the absorber layer has a coating weight of about 0.02 $g/m^2$ to about 2 $g/m^2$, preferably about 0.05 $g/m^2$ to about 1.5 $g/m^2$. Elements that comprise an absorber layer are disclosed in Shimazu, U.S. Pat. No. 6,593,055, the disclosure of which is incorporated herein by reference.

To minimize migration of the photothermal conversion material from the underlayer to the top layer during manufacture and storage of the imageable element, the element may comprise a barrier layer between the underlayer and the top layer. The barrier layer comprises a polymeric material that is soluble in the developer. If this polymeric material is different from the polymeric material in the underlayer, it is preferably soluble in at least one organic solvent in which the polymeric material in the underlayer is insoluble. A preferred polymeric material for the barrier layer is polyvinyl alcohol. When the polymeric material in the barrier layer is different from the polymeric material in the underlayer, the barrier layer should be less than about one-fifth as thick as the underlayer, preferably less than a tenth of the thickness of the underlayer.

Photothermal Conversion Material

Imageable elements that are to be imaged with infrared radiation typically comprise an infrared absorber, known as a photothermal conversion material. Photothermal conversion materials absorb radiation and convert it to heat. The photothermal conversion material may be present in the top layer, in the underlayer and/or in a separate absorber layer between the top layer and the underlayer. Although a photothermal conversion material is not necessary for imaging with a hot body, imageable elements that contain a photothermal conversion material may also be imaged with a hot body, such as a thermal head or an array of thermal heads.

The photothermal conversion material may be any material that can absorb radiation and convert it to heat. Suitable materials include dyes and pigments. Suitable pigments include, for example, carbon black, Heliogen Green, Nigrosine Base, iron (III) oxide, manganese oxide, Prussian Blue, and Paris blue. Because of its low cost and wide absorption bands that allow it to be used with imaging devices having a wide range of peak emission wavelengths, one particularly useful pigment is carbon black. The size of the pigment particles should not be more than the thickness of the layer that contains the pigment. Preferably, the size of the particles will be half the thickness of the layer or less.

To prevent sludging of the developer by insoluble material, photothermal conversion materials that are soluble in the developer are preferred. The photothermal conversion material may be a dye with the appropriate absorption spectrum and solubility. Dyes, especially dyes with a high extinction coefficient in the range of 750 nm to 1200 nm, are preferred. Examples of suitable dyes include dyes of the following classes: methine, polymethine, arylmethine, cyanine, hemicyanine, streptocyanine, squarylium, pyrylium, oxonol, naphthoquinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polypyrrole, polythiophene, chalcogenopyryloarylidene and bis (chalcogenopyrylo)polymethine, oxyindolizine, pyrazoline azo, and oxazine classes. Absorbing dyes are disclosed in numerous publications, for example, Nagasaka, EP 0,823, 327; DeBoer, U.S. Pat. No. 4,973,572; Jandrue, U.S. Pat. No. 5,244,771; Patel, U.S. Pat. No. 5,208,135; Chapman, U.S. Pat. No. 5,401,618; and in Kunita, U.S. Pat. No. 6,670,098, column 12, line 15, to column 24, line 35. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), SpectraIR 830A and SpectraIR 840A (Spectra Colors), as well as IR Dye A, and IR Dye B, whose structures are shown below.

IR Dye A

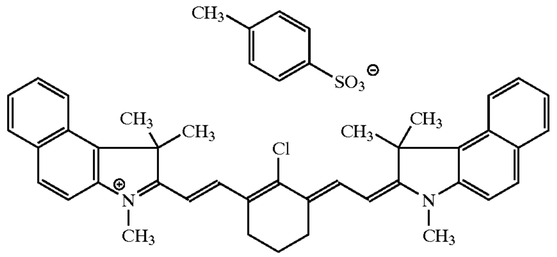

IR Dye B

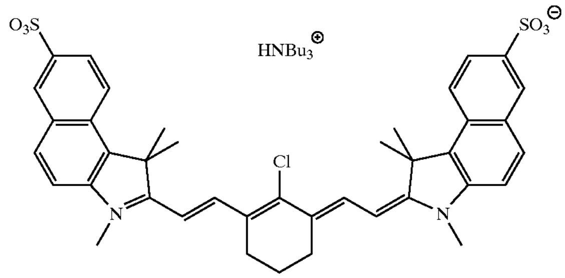

Water-soluble photothermal conversion materials include, for example, cyanine dyes with one or more sulfate and/or sulfonate groups. Other infrared absorbing cyanine anions that contain two to four sulfonate groups are disclosed, for example, in West, U.S. Pat. No. 5,107,063; Pearce, U.S. Pat. No. 5,972,838; Chapman, U.S. Pat. No. 6,187,502; Fabricius, U.S. Pat. No. 5,330,884; and Japanese Laid Open Application No. 63-033477. The preparation of cyanine dyes with polysulfonate anions is disclosed, for example, in U.S. patent application Ser. No. 10/722,257, filed Nov. 25, 2003. The preparation of N-alkyl sulfate cyanine compounds is disclosed, for example, in U.S. patent application Ser. No. 10/736,364, filed Dec. 15, 2003.

The amount of photothermal conversion present in the element is generally sufficient to provide an optical density of at least 0.05, and preferably, an optical density of from about 0.5 to at least about 2 to 3 at the imaging wavelength. As is well known to those skilled in the art, the amount of compound required to produce a particular optical density at a particular wavelength can be determined using Beer's law. Although the amount present will depend on the compound or compounds chosen, when the photothermal conversion material is only present in the underlayer or in the top layer, it typically comprises about 5 to 20 wt %, more typically about 10 wt % to about 20 wt % of the layer, even more typically about 15 wt % of the underlayer.

To prevent ablation during imaging with infrared radiation, when the element is a multi-layer imageable element, the top layer is preferably substantially free of photothermal conversion material. That is, the photothermal conversion material in the top layer, if any, absorbs less than about 10% of the imaging radiation, preferably less than about 3% of the imaging radiation, and the amount of imaging radiation absorbed by the top layer, if any, is not enough to cause ablation of the top layer.

Single Layer Elements

Single layer elements comprise a top layer which comprises the alkali soluble co-polymer. The top layer becomes soluble or dispersible in the developer following thermal exposure. Single layer imageable elements do not comprise the underlayer. The top layer is either on the substrate or the element consists of the substrate, an absorber layer, and the top layer. The element comprises a photothermal conversion material, which is either in the top layer and/or, if present, in the absorber layer. The top layer is ink receptive. Before thermal imaging, the top layer is not removable by an alkaline developer, but after thermal imaging the imaged regions of the top layer are removable by the developer.

The top layer comprises about 50 to about 80 wt % of a phenolic resin or mixture of phenolic resins such as described above; about 2 to about 10 wt % of a photothermal conversion material or mixture of photothermal conversion material, such as is described above; about 2 to about 10 wt % of a of dissolution inhibitor or mixture of dissolution inhibitors, such as is described above; and about 10 to about 30 wt %, preferably about 15 to about 25 wt % of the alkali soluble co-polymer or mixture of alkali soluble co-polymers. The preferred phenolic resins are novolac resins, such as are described above. The preferred dissolution inhibitors are triarylmethane dyes, such as are described above. These dyes can also act as contrast dyes, which distinguish the unimaged regions from the imaged regions in the developed imageable element.

Preparation of the Imageable Element

The terms "solvent" and "coating solvent" include mixtures of solvents. These terms are used although some or all of the materials may be suspended or dispersed in the solvent rather than in solution. Selection of coating solvents depends on the nature of the components present in the various layers. The imageable element may be prepared by sequentially applying the underlayer, if present, over the hydrophilic surface of the substrate; applying the absorber layer or the barrier layer if present, over the underlayer; and then applying the top layer using conventional techniques. When no other layers are present, the top layer is coated directly onto the substrate.

The layers may be applied by any conventional method, such as coating or lamination. Typically the ingredients are dispersed or dissolved in a suitable coating solvent, and the resulting mixture coated by conventional methods, such as spin coating, bar coating, gravure coating, die coating, or roller coating. The underlayer may be applied, for example, from mixtures of methyl ethyl ketone, 1-methoxypropan-2-ol, y-butyrolactone, and water; from mixtures of diethyl ketone, water, methyl lactate, and y-butyrolactone; and from mixtures of diethyl ketone, water, and methyl lactate.

Preparation of imageable elements that comprise a barrier layer is disclosed in Patel, U.S. Pat. No. 6,723,490, the disclosure of which is incorporated herein by reference. Preparation of imageable elements that comprise an absorber layer is disclosed in Shimazu, U.S. Pat. No. 6,593,055, the disclosure of which is incorporated herein by reference. When neither a barrier layer nor an absorber layer is present, the top layer is coated on the underlayer. To prevent the underlayer from dissolving and mixing with the top layer, the top layer should be coated from a solvent in which the underlayer is essentially insoluble. Thus, the coating solvent for the top layer should be a solvent in which the components of the top layer are sufficiently soluble that the top layer can be formed and in which any underlying layers are essentially insoluble. Typically, the solvents used to coat the underlying layers are more polar than the solvent used to coat the top layer. The top layer may be applied, for example, from diethyl ketone, or from mixtures of diethyl ketone and 1-methoxy-2-propyl acetate. An intermediate drying step, i.e., drying the underlayer to remove coating solvent before coating the top layer over it, may also be used to prevent mixing of the layers.

Alternatively, the underlayer, the top layer, or both layers may be applied by conventional extrusion coating methods from a melt mixture of layer components. Typically, such a melt mixture contains no volatile organic solvents.

Imaging and Processing

The imageable elements may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include image setters such as the CREO® Trendsetter (Creo, Burnaby, British Columbia, Canada), the Screen PlateRite model 4300, model 8600, and model 8800 (Screen, Rolling Meadows, Chicago, Ill., USA), and the Gerber Crescent 42T (Gerber Systems, South Windsor, Conn., USA).

Alternatively, the imageable element may be thermally imaged using a hot body, such as a conventional apparatus containing a thermal printing head. A suitable apparatus includes at least one thermal head but would usually include a thermal head array, such as a TDK Model No. LV5416 used in thermal fax machines and sublimation printers, the GS618-400 thermal plotter (Oyo Instruments, Houston, Tex., USA), or the Model VP-3500 thermal printer (Seikosha America, Mahwah, N.J., USA).

Imaging produces an imaged element, which comprises a latent image of imaged (exposed) regions and complementary unimaged (unexposed) regions. Development of the imaged element to form a printing plate, or printing form, converts the latent image to an image by removing the imaged regions, revealing the hydrophilic surface of the underlying substrate.

The developer may be any liquid or solution that can penetrate and remove the imaged regions of the top layer, the underlying regions of, if present, the absorber layer or barrier layer, and the underlying regions of the underlayer without substantially affecting the complimentary unimaged regions. Development is carried out for a long enough time to remove the imaged regions of the top layer, the underlying regions of, if present, the absorber layer, barrier layer, and/or the underlayer in the developer, but not long enough to remove the unimaged regions of the top layer. Hence, the imaged regions are described as being "soluble" or "removable" in the developer because they are removed, and dissolved and/or dispersed, more rapidly in the developer than the unimaged regions. Typically, the underlayer is dissolved in the developer, the absorber layer is either dissolved or dispersed in the developer, and the top layer is dispersed in the developer.

Common components of developers are surfactants; chelating agents, such as salts of ethylenediamine tetraacetic acid; organic solvents such as benzyl alcohol and phenoxyethanol; and alkaline components such as inorganic metasilicates, organic metasilicates, hydroxides or bicarbonates. Typical aqueous alkaline developers are those that have a pH between about 8 and about 13.5, typically at least about 11, preferably at least about 12.

Solvent-based alkaline developers, which are typically used with negative working imageable elements, are excellent developers for use with the imageable elements of this invention. Solvent-based developers comprise an organic solvent or a mixture of organic solvents. The developer is a single phase. Consequently, the organic solvent must be miscible with water, or at least soluble in the developer to the extent it is added to the developer, so that phase separation does not occur. The following solvents and mixtures of these solvents are suitable for use in the developer: the reaction products of phenol with ethylene oxide and propylene oxide, such as ethylene glycol phenyl ether (phenoxyethanol); benzyl alcohol; esters of ethylene glycol and of propylene glycol with acids having six or fewer carbon atoms, and ethers of ethylene glycol, diethylene glycol, and of propylene glycol with alkyl groups having six or fewer carbon atoms, such as 2-methoxyethanol and 2-butoxyethanol. A single organic solvent or a mixture of organic solvents can be used. The organic solvent is typically present in the developer at a concentration of between about 0.5 wt % to about 15 wt %, based on the weight of the developer, preferably between about 3 wt % and about 5 wt %, based on the weight of the developer. Useful commercially available solvent-based developers include ND-1 Developer, 956 Developer, and 955 Developer (Kodak Polychrome Graphics, Norwalk, Conn., USA.).

Other useful developers include aqueous solutions having a pH of about 7 or above. Typical aqueous alkaline developers are those that have a pH between about 8 and about 13.5, typically at least about 11, preferably at least about 12. Useful commercially available aqueous alkaline developers include 3000 Developer and 9000 Developer (Kodak Polychrome Graphics, Norwalk, Conn., USA).

The developer may also comprise a surfactant or a mixture of surfactants. Preferred surfactants include: alkali metal salts of alkyl naphthalene sulfonates; alkali metal salts of the sulfate monoesters of aliphatic alcohols, typically having six to nine carbon atoms; and alkali metal sulfonates, typically having six to nine carbon atoms. A preferred alkali metal is sodium. The surfactant or mixture of surfactants typically comprises about 0.5 wt % to about 15 wt % based on the weight of the developer, preferably about 3 wt % to about 8 wt %, based on the weight of the developer.

A developer may also comprise a buffer system to keep the pH relatively constant, typically between about 5.0 and about 12.0, preferably between about 6.0 and about 11.0, more preferably between about 8.0 and about 10.0. Numerous buffer systems are known to those skilled in the art. Typically buffer systems include, for example: combinations of water-soluble amines, such as mono-ethanol amine, diethanol amine, tri-ethanol amine, or tri-i-propyl amine, with a sulfonic acid, such benzene sulfonic acid or 4-toluene sulfonic acid; mixtures of the tetra sodium salt of ethylene diamine tetracetic acid (EDTA) and EDTA; mixtures of phosphate salts, such as mixtures of mono-alkali phosphate salts with tri-alkali phosphate salts; and mixtures of alkali borates and boric acid. Water typically comprises the balance of the developer.

The developer is typically applied to the imaged imageable element by spraying the element with sufficient force to remove the imaged regions. Alternatively, development may be carried out in a processor equipped with an immersion-type developing bath, a section for rinsing with water, a gumming section, a drying section, and a conductivity-measuring unit, or the imaged imageable element may be brushed with the developer. In each instance, a printing plate is produced. Development may conveniently be carried out in a commercially available spray-on processor, such as an 85 NS (Kodak Polychrome Graphics).

Following development, the resulting printing plate is rinsed with water and dried. Drying may be conveniently carried out by infrared radiators or with hot air. After drying, the printing plate may be treated with a gumming solution. A gumming solution comprises one or more water-soluble polymers, for example cellulose, polyvinylalcohol, polymethacrylic acid, polymethacrylamide, polyvinylmethylether, polyhydroxyethylmethacrylate, gelatin, and polysaccharide such as dextran, pullulan, gum arabic, and alginic acid. A preferred material is gum arabic.

A developed and gummed plate may also be baked to increase the run length of the plate. Baking can be carried out, for example at about 220° C. to about 240° C. for about 7 minutes to 10 minutes, or at a temperature of 120° C. for 30 minutes.

INDUSTRIAL APPLICABILITY

The imageable elements of the invention have excellent resistance to press room chemicals. They can be thermally imaged and developed with an aqueous alkaline developer to form lithographic printing plates. Once the imageable element has been imaged and developed to form a lithographic printing plate, printing can then be carried out by applying a fountain solution and then lithographic ink to the image on its surface. The fountain solution is taken up by the surface of the hydrophilic substrate revealed by the imaging and development process, and the ink is taken up by the regions of the layer or layers not removed by the development process. The ink is then transferred to a suitable receiving material (such as cloth, paper, metal, glass or plastic) either directly or indirectly using an offset printing blanket to provide a desired impression of the image thereon.

The advantageous properties of this invention can be observed by reference to the following examples, which illustrate but do not limit the invention.

EXAMPLES

| Glossary | |
|---|---|
| AIBN | 2,2'-Azobisisobutyronitrile (DuPont, Wilmington, Delaware, USA) |
| BYK-307 | Polyethoxylated dimethylpolysiloxane co-polymer (BYK Chemie, Wallingford, CT, USA) |
| Co-polymer 1 | Alkali soluble co-polymer, N-phenylmaleimide (50 mol %), methacrylic acid (20 mol %), methacrylamide (5 mol %), and Monomer A (25 mol %) |
| Co-polymer 2 | Alkali soluble co-polymer, N-phenylmaleimide (50 mol %), methacrylic acid (20 mol %), methacrylamide (5 mol %), and Monomer B (25 mol %) |
| Co-polymer 3 | Alkali soluble co-polymer, N-phenylmaleimide (5 wt %), methacrylamide (10 wt %), acrylonitrile (45 wt %), and monomer A (40 wt %) |
| Co-polymer 4 | Alkali soluble co-polymer, N-phenylmaleimide (45 mol %), methacrylic acid (30 mol %), and monomer B (25 mol %) |
| Co-polymer 5 | Alkali soluble co-polymer, N-phenylmaleimide (40 mol %), methacrylic acid (30 mol %), methacrylamide (5 mol %), and monomer B (25 mol %) |
| CREO ® Trendsetter 3244x | Commercially available platesetter, using Procom Plus software and having a laser diode array emitting at 830 nm (Creo Products, Burnaby, BC, Canada) |
| DAA | Diacetone alcohol (4-hydroxy-4-methyl-2-pentanone) |
| Ethyl violet | C.I. 42600; CAS 2390-59-2 ($lambda_{max}$ = 596 nm) $[(p-(CH_3CH_2)_2NC_6H_4)_3C^+ Cl^-]$ (Aldrich, Milwaukee, WI, USA) |

-continued

| Glossary | |
|---|---|
| IR Dye A | Infrared absorbing dye (lambda$_{max}$ = 830 nm) (Eastman Kodak, Rochester, NY, USA) (see structure above) |
| ND-1 Developer | Solvent based negative developer (Kodak Polychrome Graphics, Norwalk, CT, USA) |
| Substrate A | 0.3 mm gauge, aluminum sheet which had been electrograined, anodized and treated with a solution of polyvinyl phosphonic acid |

Example 1

This example illustrates the synthesis of Monomer A.

MONOMER A

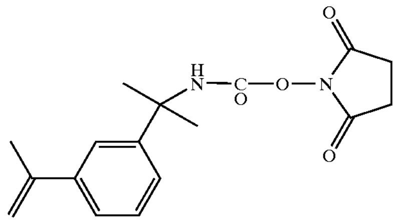

N,N-Dimethylacetamide (125 g) and N-hydroxysuccinimide (45.99 g, 0.40 mol) were added to a 500 ml flask and dispersed. A few drops of dibutyltin dilaurate was added. 1-(1-Isocyanato-1-methyl)-ethyl 3-(1-methyl)-ethenyl benzene (70.69 g, 0.35 mol) was dropped into this mixture over 1 h, with cooling below 40° C. Next, the mixture was stirred for 6 h at room temperature. Infrared spectrometry showed that no isocyanate functionality remained. Concentrated hydrochloric acid (2.5 ml) was added to the reaction mixture, and the mixture stirred for 15 min. The mixture was poured into 1.5 L of water, and the resulting precipitate filtered, washed with 500 ml of water, and dried under vacuum (<40° C.). 100.1 g of Monomer A (FW=316) was obtained. Yield: 90.1%.

Example 2

This example illustrates the synthesis of Monomer B.

MONOMER B

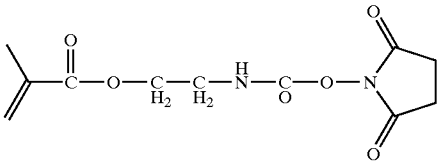

The procedure of Example 1 was repeated, except that the 1-(1-isocyanato-1-methyl)-ethyl 3-(1-methyl)-ethenyl benzene was replaced with methacryloyl oxyethyl isocyanate (63.79 g, 0.41 mol) and 50.47 g (0.44 moles) N-hydroxysuccinimide was used. 98.9 g of Monomer B (FW=254) was obtained. Yield: 94.7%.

Example 3

This example illustrates the synthesis of alkali soluble Co-polymer 1. N-phenylmaleimide (18.51 g), methacrylic acid (3.68 g), methacrylamide (0.91 g), monomer A (16.90 g) and dioxolane/ethanol (50:50 (v:v); 126.01 g) were added to a 1 L reaction kettle fitted with a Liebig condenser, a nitrogen supply, a thermometer, a stirrer, and a heating mantle. Nitrogen was bubbled through the reaction mixture for 1 hr and the temperature raised to 60 C. A solution of AIBN (0.054 g) in dioxolane/ethanol (10 g) was added to the reaction mixture. The reaction mixture was stirred under a nitrogen atmosphere for about 20 h at 60 C. The reaction mixture was slowly added, with stirring, to 1 L of water to which 5 drops of concentrated hydrochloric acid had been added. The resulting precipitate was filtered off, washed with 1 L of ethanol/water (80:20), filtered again, and dried for 2 days at 50° C. Yield: 24.26 g of alkali soluble Co-polymer 1 (61%).

Example 4

This example illustrates the synthesis of alkali soluble Co-polymer 2. The procedure of Example 3 was repeated except that N-phenylmaleimide (19.72 g), methacrylic acid (3.92 g), methacrylamide (0.97 g), and Monomer B (15.39 g) was used. Yield: 31.68 g of alkali soluble Co-polymer 2 (77%).

Example 5

This example illustrates the synthesis of alkali soluble Co-polymer 3. The procedure of Example 3 was repeated except that N-phenylmaleimide (2.00 g), methacrylamide (4.00 g), acrylonitrile (18.00 g), and Monomer A (16.00 g) was used. Yield: 19.00 g of alkali soluble Co-polymer 3 Yield: 47.5%.

Example 6

This example illustrates the synthesis of alkali soluble Co-polymer 4. The procedure of Example 3 was repeated except that N-phenylmaleimide (18.20 g), methacrylic acid (6.03 g), and monomer B (15.77 g) was used. Yield: 33.60 g of alkali soluble Co-polymer 4 (84%).

Example 7

This example illustrates the synthesis of alkali soluble Co-polymer 5. The procedure of Example 3 was repeated except N-phenylmaleimide (16.60 g), methacrylic acid (6.09 g), methacrylamide (1.02 g), and Monomer B (16.19 g) was used. Yield: 33.78 g of alkali soluble Co-polymer 5 (85%).

Example 8

Imageable elements were prepared by the following procedure.

Underlayer: A coating solution containing 6.5 wt % of a mixture of 84.5 wt % of an alkali soluble co-polymer, 15 wt % of IR Dye A, and 0.5 wt % of BYK 307 in a mixture of 2-butanone/1-methoxy-2-propanol/gamma-butyrolactone/water (65:15:10:10 by weight) was coated onto Substrate A using a 0.03 in wire wound bar, and the resulting element dried at 135° C. for 35 sec. Coating weight of the underlayer: 1.3 g/m$^2$.

Top layer: A coating solution containing 99.1 wt % of a polystyrene/maleic anhydride co-polymer (MW 1600) (Aldrich, Milwaukee, Wis., USA), 0.4 wt % of ethyl violet, and 0.5 wt % of BYK 307 in diethylketone/1-methoxy-2-propanol acetate was coated onto the underlayer using a 0.015 cm (0.006 in) wire wound bar, and the resulting imageable element dried at 135° C. for 35 sec. Coating weight of the top layer: 0.7 g/m$^2$.

Elements consisting of the underlayer on the substrate were evaluated in the following tests. The results are shown in Table 1.

Developer Solubility Test Drops of water/Developer ND-1 (4:1) were applied to the underlayer at 2 sec intervals up to 30 sec, then washed off immediately with water. The time to fully dissolve the underlayer was recorded.

Resistance to UV Wash Drops of diacetone alcohol/water (4:1) were placed on the underlayer at 1 min intervals up to 5 min, then washed off with water. The amount of underlayer removed after 1 min was estimated.

Resistance to Alcohol-Sub Fount Drops of 2-butoxythanol/water (4:1) were placed on the underlayer at 1 min intervals up to 5 min, then washed off with water. The amount of underlayer removed after 1 min was estimated.

Baking Test Elements consisting of the underlayer on the substrate were baked in a Mathis Labdrier oven at 230° C. for 8 min with a fan speed of 1000 rpm. Positive image remover, PE3S (Kodak Polychrome Graphics, Japan Ltd) was applied at 2 min intervals up to 12 min, then rinsed with water. The time taken for the image remover to start attacking the underlayer was recorded.

TABLE 1

| Alkali Soluble Co-polymer | Developer Solubility Test | Resistance to UV Wash[a] | Resistance to Alcohol-Sub Fount[a] | Baking Test |
|---|---|---|---|---|
| 4 | 8 sec | 30% | 5% | No attack at 12 min |
| 5 | 8 sec | 25% | 5% | No attack at 12 min |

[a]% underlayer removed in 1 min

The imageable elements consisting of the top layer, underlayer, and substrate were evaluated in the following tests.

Developer Solubility Test Drops of water/Developer ND-1 (4:1) were applied to the top layer at 30 sec intervals up to 4 min, then washed off immediately with water. The time for the developer to start attacking the top layer was recorded.

Imaging and Processing Tests The imageable elements were thermally imaged on a CREO® Trendsetter 3244 at 8 watts using plot 0 and plot 12 internal test patterns. The imaging energies were 136, 115, 100, 88, and 79 mJ/cm$^2$. The resulting imaged imageable elements were developed at 30° C. in a PK910II processor (Kodak Polychrome Graphics, Norwalk, Conn., USA) using water/ND-1 Developer (4:1) and an immersion time of 12 sec. The resulting lithographic printing plates were evaluated for cleanout (lowest imaging energy at which the imaged regions are completely removed by the developer), and best resolution (imaging energy at which printing plate performs best).

TABLE 2

| Alkali Soluble | Developer | Imaging Tests | |
|---|---|---|---|
| Co-polymer | Solubility Test | Clean Out | Best Exposure |
| 1 | 60 seconds | 95 mJ/cm$^2$ | 112 mJ/cm$^2$ |
| 2 | 60 seconds | 90 mJ/cm$^2$ | 105 mJ/cm$^2$ |

Having described the invention, we now claim the following and their equivalents.

What is claimed is:

1. An imageable element comprising a top layer over a substrate, in which:

the imageable element comprises a co-polymer or mixture of co-polymers, that comprise, in polymerized form:

(a) about 10 wt % to 75 wt % of a monomer selected from the group consisting of monomers of structure I, monomers of structure II, and mixtures thereof;

Structure I

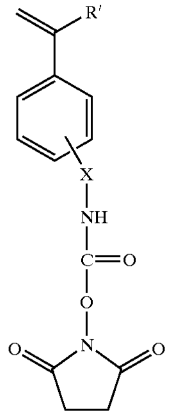

Structure II

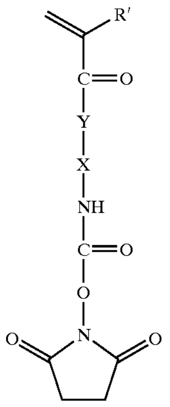

in which:

R' is hydrogen, halogen, or $C_1$ to $C_6$ alkyl;

X is $—C(CH_3)_2—$, $—(CH_2)_n—$, or $—CH(CH_3)—$;

Y=—N(H)— or —O—; and n=0 to 12;

the co-polymer or mixture of copolymers is soluble in an alkaline solution having a pH greater than about 8;

the top layer is not removable by an alkaline developer before thermal imaging;

imaged regions of the top layer are removable by the alkaline developer after thermal imaging;

the imageable element additionally comprises a photothermal conversion material or a mixture of photothermal conversion materials;

the imageable element comprises an underlayer between the top layer and the substrate; and the underlayer comprises the photothermal conversion material and the co-polymer.

2. The imageable element of claim 1 in which the co-polymer additionally comprises, in polymerized form:

(b) about 1 mol % to about 55 mol % of a monomer selected from the group consisting of N-phenylmaleimide, N-cyclohexylmaleimide, N-benzylmaleimide, and mixtures thereof; and in polymerized form, two or more of:

(c) about 5 mol % to 40 mol % of a monomer selected from the group consisting of acrylic acid, methacrylic acid, and mixtures thereof;

(d) about 1 wt % to about 30 wt % of a monomer selected from the group consisting of acrylamide, methacrylamide, and mixtures thereof; and (e) about 20 wt % to about 80 wt % of a monomer selected from the group consisting of acrylonitrile, methacrylonitrile, and mixtures thereof.

3. An imageable element comprising a top layer over a substrate, in which:

the imageable element comprises a co-polymer or mixture of co-polymers, that comprise, in polymerized form:

(a) about 10 wt % to 75 wt % of a monomer selected from the group consisting of monomers of structure I, monomers of structure II, and mixtures thereof;

Structure I

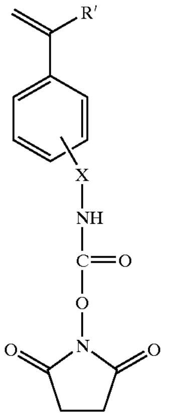

Structure II

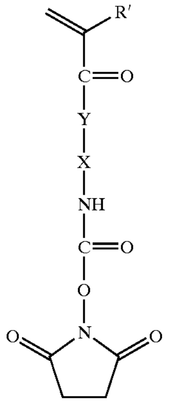

in which:

R' is hydrogen or methyl;

X is $—C(CH_3)_2—$, $—(CH_2)_n—$, or $—CH(CH_3)—$;

Y is —O—; and n=0 to 4;

the co-polymer or mixture of copolymers is soluble in an alkaline solution having a pH greater than about 8;

the top layer is not removable by an alkaline developer before thermal imaging; and imaged regions of the top layer are removable by the alkaline developer after thermal imaging; and the imageable element additionally comprises a photothermal conversion material or a mixture of photothermal conversion materials.

4. The imageable element of claim 3 in which the co-polymer additionally comprises, in polymerized form, two or more of:

(b) about 1 mol to about 55 mol % of a monomer selected from the group consisting of N-phenylmaleimide, N-cyclohexylmaleimide, N-benzylmaleimide, and mixtures thereof;

(c) about 5 mol % to 40 mol % of a monomer selected from the group consisting of acrylic acid, methacrylic acid, and mixtures thereof;

(d) about 1 wt % to about 30 wt % of a monomer selected from the group consisting of acrylamide, methacrylamide, and mixtures thereof; and (e) about 20 wt % to about 80 wt % of a monomer selected from the group consisting of acrylonitrile, methacrylonitrile, and mixtures thereof.

5. The imageable element of claim 3 in which the co-polymer additionally comprises, in polymerized form:

(b) about 1 mol % to about 55 mol % of a monomer selected from the group consisting of N-phenylmaleimide, N-cyclohexylmaleimide, N-benzylmaleimide, and mixtures thereof; and, in polymerized form, two or more of:

(c) about 5 mol % to 40 mol % of a monomer selected from the group consisting of acrylic acid, methacrylic acid, and mixtures thereof;

(d) about 1 wt % to about 30 wt % of a monomer selected from the group consisting of acrylamide, methacrylamide, and mixtures thereof; and (e) about 20 wt % to about 80 wt % of a monomer selected from the group consisting of acrylonitrile, methacrylonitrile, and mixtures thereof.

6. The imageable element of claim 5 in which the monomer selected from the group consisting of N-phenylmaleimide, N-cyclohexylmaleimide, N-benzylmaleimide, and mixtures thereof is N-phenylmaleimide; the monomer selected from the group consisting of acrylic acid, methacrylic acid, and mixtures thereof is methacrylic acid; the monomer selected from the group consisting of acrylamide, methacrylamide, and mixtures thereof is methacrylamide; and the monomer selected from the group consisting of acrylonitrile, methacrylonitrile, and mixtures thereof is acrylonitrile.

7. The imageable element of claim 6 in which the top layer comprises the co-polymer;

the imageable element comprises an absorber layer which is on the substrate;

the absorber layer comprises the photothermal conversion material;

the top layer is on the absorber layer; and the top layer comprises about 50 to about 80 wt % of a phenolic resin or mixture of phenolic resins; about 2 to about 10 wt % of a dissolution inhibitor or mixture of dissolution inhibitors; and about 10 to about 30 wt % of the co-polymer or mixture of co-polymers.

8. The imageable element of claim 6 in which:

the top layer comprises the co-polymer;

the top layer comprises the photothermal conversion material or mixture of photothermal conversion materials;

the top layer is on the substrate; and the top layer comprises about 50 to about 80 wt % of a phenolic resin or mixture of phenolic resins; about 2 to about 10 wt % of the photothermal conversion material or mixture of photothermal conversion material; about 2 to about 10 wt % of a of a dissolution inhibitor or mixture of dissolution inhibitors; and about 10 to about 30 wt % of the co-polymer or mixture of co-polymers.

9. The imageable element of claim 8 in which the phenolic polymer is a novolac resin.

10. The imageable element of claim 6 in which:

the element comprises, in order, the top layer, an absorber layer, an underlayer, and the substrate;

the absorber layer consists essentially of the photothermal conversion material; and the underlayer comprises the co-polymer.

11. The imageable element of claim 6 in which:

the element comprises, in order, the top layer, an underlayer, and the substrate; and the underlayer comprises the photothermal conversion material and the co-polymer.

12. The imageable element of claim 11 in which the top layer comprises a polystyrene/maleic anhydride co-polymer.

13. The imageable element of claim 11 in which the top layer comprises a phenolic resin and a dissolution inhibitor.

14. A method for forming an image, the method comprising the steps of:

(i) thermally imaging an imageable element comprising a substrate and a top layer over the substrate; and forming an imaged imageable element comprising imaged regions and complementary unimaged regions in the top layer;

in which:

the imageable element comprises a co-polymer or mixture of co-polymers, that comprise, in polymerized form:

(a) about 10 wt % to 75 wt % of a monomer selected from the group consisting of monomers of structure I, monomers of structure II, and mixtures thereof;

Structure I

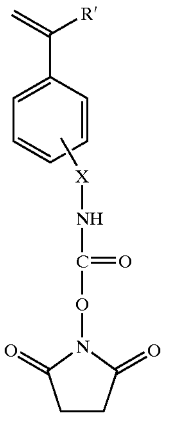

-continued

Structure II

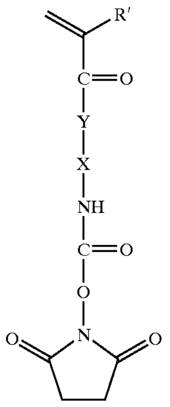

in which:

R' is hydrogen, halogen, or $C_1$ to $C_6$ alkyl;

X is $—C(CH_3)_2—$, $—(CH_2)_n—$, or $—CH(CH_3)—$;

Y=—N(H)— or —O—; and n=0 to 12;

the co-polymer or mixture of copolymers is soluble in an alkaline solution having a pH greater than about 8;

the top layer is not removable by an alkaline developer before thermal imaging; and imaged regions of the top layer are removable by the alkaline developer after thermal imaging; and (ii) the forming the image by developing the imaged imageable element with the alkaline developer and removing the imaged regions.

15. The method of claim 14 in which the developer is a solvent-based developer.

16. The method of claim 14 in which the developer has a pH of 12 to 14.

17. The method of claim 14 in which R' is hydrogen or methyl; Y is —O—; and n=0 to 4.

18. The method of claim 17 in which the imageable element additionally comprises a photothermal conversion material or a mixture of photothermal conversion materials.

19. The method of claim 18 in which thermal imaging is carried out with infrared radiation.

20. The method of claim 19 in which the co-polymer additionally comprises, in polymerized form, two or more of:

(b) about 1 mol % to about 55 mol % of a monomer selected from the group consisting of N-phenylmaleimide, N-cyclohexylmaleimide, N-benzylmaleimide, and mixtures thereof;

(c) about 5 mol % to 40 mol % of a monomer selected from the group consisting of acrylic acid, methacrylic acid, and mixtures thereof;

(d) about 1 wt % to about 30 wt % of a monomer selected from the group consisting of acrylamide, methacrylamide, and mixtures thereof; and (e) about 20 wt % to about 80 wt % of a monomer selected from the group consisting of acrylonitrile, methacrylonitrile, and mixtures thereof.

21. The method of claim 19 in which the co-polymer additionally comprises, in polymerized form:

(b) about 1 mol % to about 55 mol % of a monomer selected from the group consisting of N-phenylmaleimide, N-cyclohexylmaleimide, N-benzylmaleimide, and mixtures thereof; and, in polymerized form, two or more of:

(c) about 5 mol % to 40 mol % of a monomer selected from the group consisting of acrylic acid, methacrylic acid, and mixtures thereof;

(d) about 1 wt % to about 30 wt % of a monomer selected from the group consisting of acrylamide, methacrylamide, and mixtures thereof; and (e) about 20 wt % to about 80 wt % of a monomer selected from the group consisting of acrylonitrile, methacrylonitrile, and mixtures thereof.

22. The method of claim 21 in which the monomer selected from the group consisting of N-phenylmaleimide, N-cyclohexylmaleimide, N-benzylmaleimide, and mixtures thereof is N-phenylmaleimide; the monomer selected from the group consisting of acrylic acid, methacrylic acid, and mixtures thereof is methacrylic acid; the monomer selected from the group consisting of acrylamide, methacrylamide, and mixtures thereof is methacrylamide; and the monomer selected from the group consisting of acrylonitrile, methacrylonitrile, and mixtures thereof is acrylonitrile.

23. The method of claim 22 in which:

the top layer comprises the co-polymer;

the top layer comprises the photothermal conversion material or mixture of photothermal conversion materials;

the top layer is on the substrate; and the top layer comprises about 50 to about 80 wt % of a phenolic resin or mixture of phenolic resins; about 2 to about 10 wt % of the photothermal conversion material or mixture of photothermal conversion material; about 2 to about 10 wt % of a of a dissolution inhibitor or mixture of dissolution inhibitors; and about 10 to about 30 wt % of the co-polymer or mixture of co-polymers.

24. The method of claim 23 in which the phenolic polymer is a novolac resin.

25. The method of claim 22 in which:

the element comprises, in order, the top layer, an underlayer, and the substrate; and the underlayer comprises the photothermal conversion material and the co-polymer.

26. The method of claim 25 in which the top layer comprises a polystyrene/maleic anhydride co-polymer.

27. The method of claim 25 in which the top layer comprises a phenolic resin and a dissolution inhibitor.

28. The method of claim 27 in which the developer is a solvent-based developer.

29. The imageable element of claim 2 in which the monomer selected from the group consisting of N-phenylmaleimide, N-cyclohexylmaleimide, N-benzylmaleimide, and mixtures thereof is N-phenylmaleimide; the monomer selected from the group consisting of acrylic acid, methacrylic acid, and mixtures thereof is methacrylic acid; the monomer selected from the group consisting of acrylamide, methacrylamide, and mixtures thereof is methacrylamide; and the monomer selected from the group consisting of acrylonitrile, methacrylonitrile, and mixtures thereof is acrylonitrile.

* * * * *